(12) United States Patent
Peterson et al.

(10) Patent No.: US 7,723,815 B1
(45) Date of Patent: May 25, 2010

(54) WAFER BONDED COMPOSITE STRUCTURE FOR THERMALLY MATCHING A READOUT CIRCUIT (ROIC) AND AN INFRARED DETECTOR CHIP BOTH DURING AND AFTER HYBRIDIZATION

(75) Inventors: Jeffrey M Peterson, Santa Barbara, CA (US); Eric F Schulte, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 750 days.

(21) Appl. No.: 10/888,224

(22) Filed: Jul. 9, 2004

(51) Int. Cl.
*H01L 27/14* (2006.01)

(52) U.S. Cl. .................. 257/443; 257/442; 257/444; 257/457; 257/459; 257/E21.487; 257/E31.058

(58) Field of Classification Search ......... 257/442–444, 257/457, 459, 737, 738
See application file for complete search history.

(56) References Cited

U.S. PATENT DOCUMENTS

| | | | | |
|---|---|---|---|---|
| 5,264,699 A | * | 11/1993 | Barton et al. | 250/338.4 |
| 5,308,980 A | * | 5/1994 | Barton | 250/338.4 |
| 5,672,545 A | | 9/1997 | Trautt et al. | 437/209 |
| 6,417,514 B1 | | 7/2002 | Eneim et al. | 250/352 |
| 6,562,127 B1 | * | 5/2003 | Kud et al. | 117/94 |
| 6,864,552 B2 | * | 3/2005 | Razeghi | 257/432 |
| 2003/0102432 A1 | * | 6/2003 | Boieriu et al. | 250/338.4 |
| 2003/0160172 A1 | * | 8/2003 | Ashokan et al. | 250/338.4 |

FOREIGN PATENT DOCUMENTS

WO  WO 94/17557  *  8/1994

* cited by examiner

*Primary Examiner*—Ahmed Sefer (57) ABSTRACT

A wafer bonded composite structure is provided for matching a coefficient of thermal expansion of a first semiconductor chip to a coefficient of thermal expansion of a second semiconductor chip in order to provide a thermally matched hybridized semiconductor chip assembly. The wafer bonded composite structure includes a first semiconductor chip having a top and a bottom surface. The first semiconductor chip has a coefficient of thermal expansion which is less than the coefficient of thermal expansion of the second semiconductor chip. Preferably, the first semiconductor chip is an readout integrated circuit (ROIC) and the second semiconductor chip is an infrared detector chip. Further, the wafer bonded composite structure also includes a substrate wafer bonded to a bottom surface of the first semiconductor chip to form the wafer bonded composite structure itself. The wafer bonded substrate is preferably transparent to infrared radiation, so that the first semiconductor chip or ROIC of the resulting wafer bonded composite structure may be aligned with the second semiconductor chip or infrared detector chip before hybridization has taken place. Moreover, the composite structure has a coefficient of thermal expansion which at least substantially matches the coefficient of thermal expansion of the second semiconductor chip, thereby providing thermal matching between the first and second semiconductor chips.

12 Claims, 6 Drawing Sheets

WAFER BONDED COMPOSITE STRUCTURE FOR THERMALLY MATCHING A READOUT CIRCUIT (ROIC) AND AN INFRARED DETECTOR CHIP BOTH DURING AND AFTER HYBRIDIZATION

BACKGROUND OF THE INVENTION

1. Field of the Invention

This invention relates to matching the coefficient of thermal expansion (CTE) of one semiconductor chip to the CTE of another semiconductor chip and, more particularly to matching the CTE of an ROIC to the CTE of an infrared detector chip.

2. Prior Art

It is known in the art to hybridize different semiconductor chips together to form a hybrid array. One particular example would be hybridizing a readout integrated circuit chip (ROIC) and an infrared detector chip together to form a hybridized infrared detector array or sensor chip assembly (SCA). However, distinct semiconductor chips, such as the ROIC and the infrared detector chip, almost always have substantially different CTE's from one another, which leads to thermal mismatch problems.

One such thermal mismatch problem usually occurs when conducting the hybridization process of the ROIC to the infrared detector chip at elevated temperatures, e.g. 70-200° C. In particular, under elevated hybridization temperatures, if there is a substantial mismatch between the CTE of the ROIC and the infrared detector then a misalignment of the chips will occur. Namely, the indium bump connections between the ROIC and infrared detector chip will become misregistered or misaligned due to thermal mismatch. One result of the above thermal mismatch problems is a lessening of the number of options one has in performing hybridization of these chips.

Another major disadvantage with the prior art hybridized IR detector arrays and processes occurs when the hybridized infrared detector array is thermally cycled between room temperature and the typical 78 K (Kelvin) operating temperature. A problem arises because the ROIC chip (in most cases silicon) has a different CTE than the infrared chip (e.g. HgCdTe/CdZnTe) and a differential contraction will occur. One result is that the indium bump connections between the ROIC and the infrared chip can crack and open leading to circuit failure.

Other problems which typically result from thermal mismatch between the ROIC and the infrared detector chip manifest themselves as physical damage in the hybrid array and degraded performance. The physical damage may manifest itself as either local or global delamination of the hybrid, i.e., actual separation of the indium bumps between the detector and readout circuit, or cracking of the detector array. The performance degradation may manifest itself as a lack of uniformity between arrays, within an array, or as a general reduction in performance specifications.

Some prior art methods have attempted to rectify the above noted drawbacks using approaches discussed below. For example U.S. Pat. No. 5,672,545 to Trautt et al. ("the Trautt patent") is directed in relevant part to matching the CTE's between an ROIC and an infrared detector chip in order to provide a thermally matched flip-chip assembly. In order to accomplish this, a composite structure is designed to have a CTE which substantially matches the CTE of an infrared detector chip. The composite structure is comprised of the ROIC, a first compensation layer and a second compensation layer. The components of the composite structure are bonded together using epoxy adhesives.

In addition, U.S. Pat. No. 5,308,980 to Barton ("the Barton Patent") relates in relevant part to a hybrid detector array wherein the ROIC and the infrared detector chip are thermally matched. In particular, the Barton patent describes a hybrid infrared detector array, including a readout circuit chip hybridized to an infrared detector chip. The hybrid detector array further includes a readout circuit substrate having metal constituents which is bonded using epoxy adhesives to the bottom exposed surface of the ROIC to form a composite structure after hybridization has already taken place. The resulting composite structure is designed to have a CTE which is substantially the same as the infrared detector portion.

Further, U.S. Pat. No. 6,417,514 B1 to Eneim et al. relates in relevant part to a sensor/support system which includes a sensor assembly having a radiation detector, a readout circuit, and an interconnect joining the radiation detector to the readout circuit. The system further includes a support structure having a platform with a first side to which the sensor assembly is affixed and a second side oppositely disposed from the first side. A shim is affixed to the second side of the platform. The shim is designed to reduce the strain in the interconnect when the temperature of the sensor/support system is changed, as compared with the strain in the interconnect in the absence of the stabilization structure.

While some of the prior art noted above has addressed the issue of thermal mismatch between a readout circuit and an infrared detector chip, there is still a need in the art for an apparatus and method wherein the CTE of the ROIC is substantially matched to the infrared detector prior to hybridization. There is also a need in the art for a process of preparing a hybridized infrared detector array without the use of any adhesives, such as epoxy adhesives. The present invention fulfills these needs, and further provides related advantages.

SUMMARY OF THE INVENTION

The present invention provides a multi-layered wafer bonded substrate or wafer bonded shim structure which is preferably wafer bonded to a ROIC to form a wafer bonded composite structure which has a CTE which is the same as or at least substantially the same as the CTE of an infrared detector chip, thereby thermally matching the ROIC with the infrared detector chip. The substrate or shim is also preferably transparent to infrared radiation so one is able to align, for example by viewing through an infrared camera, the ROIC of the resulting composite structure with the infrared chip prior to hybridization taking place. By forming the composite structure prior to hybridization, the CTE of the ROIC can be matched to the infrared chip not only during thermal cycling but also during the hybridization process as well. It is also noted that other means known in the art for performing the above alignment of the ROIC with the infrared chip for hybridization may also be used in accordance with the present invention.

The composite structure is also preferably prepared by conventional direct wafer bonding processes so as to avoid the use of adhesives. Adhesives are known to cause variability in the CTE's making it very difficult to predict what the actual CTE of the structures will be.

In accordance with the invention, a wafer bonded composite structure is provided for matching a coefficient of thermal expansion of a first semiconductor chip to a coefficient of thermal expansion of a second semiconductor chip in order to provide a thermally matched hybridized semiconductor chip assembly. The wafer bonded composite structure includes a first semiconductor chip having a top and a bottom surface.

The first semiconductor chip has a coefficient of thermal expansion which is less than the coefficient of thermal expansion of the second semiconductor chip. In a preferred embodiment, the first semiconductor chip is an readout integrated circuit (ROIC) and the second semiconductor chip is an infrared detector chip. Further, the wafer bonded composite structure also includes a substrate wafer bonded bonded to a bottom surface of the first semiconductor chip to form the wafer bonded composite structure itself. The wafer bonded substrate of the wafer bonded composite structure is preferably transparent to infrared radiation. Moreover, the composite structure has a coefficient of thermal expansion which at least substantially matches the coefficient of thermal expansion of the second semiconductor chip, thereby providing thermal matching between the first and second semiconductor chips.

In accordance with another aspect of the invention, a wafer bonded composite structure is provided for matching a transverse coefficient of thermal expansion of a ROIC to a transverse coefficient of thermal expansion of an infrared detector chip in order to be able to provide a thermally matched hybrid infrared detector array. The wafer bonded composite structure includes a readout circuit (ROIC) having a top and a bottom surface. The ROIC has a transverse coefficient of thermal expansion which is less than the traverse coefficient of thermal expansion of the infrared chip detector. In addition, the wafer bonded composite structure includes a shim having a top shim layer and a bottom shim layer directly wafer bonded to one another. The top shim layer is composed of a first semiconductor material with a transverse coefficient of thermal expansion greater than said transverse coefficient of thermal expansion of said infrared detector chip and the bottom shim layer is composed of a second semiconductor material with a transverse coefficient of thermal expansion which is less than the transverse coefficient of thermal expansion of the infrared detector chip. The top shim layer of the shim is wafer bonded to the bottom surface of the ROIC to form the wafer bonded composite structure. Further, the wafer bonded shim is transparent to infrared radiation. Moreover, the composite structure has a transverse coefficient of thermal expansion, which at least substantially matches the traverse coefficient of thermal expansion of the infrared detector chip, thereby providing thermal matching between the ROIC and the infrared detector chip. It is also preferred that the ROIC and the bottom shim layer of the composite structure be composed of the same semiconductor materials, have the same traverse coefficients of thermal expansion and thicknesses as one another.

In accordance with another aspect of the invention, a method for preparing a wafer bonded composite structure is provided for matching a coefficient of thermal expansion of a ROIC, measured parallel to a traverse direction to a coefficient of thermal expansion, measured parallel to a traverse direction of an infrared detector chip in order to be able to provide a thermally matched hybrid infrared detector array. The method comprises the steps of first determining the coefficient of thermal expansion of said infrared chip, ROIC, top shim layer, bottom shim layer all measured parallel to the traverse direction. Second, determining the thicknesses needed in combination with the determined traverse coefficients of thermal expansion for the ROIC, top shim layer, bottom shim layer of the composite structure needed to achieve the desired traverse coefficient of thermal expansion for the composite structure which would at least substantially match the transverse coefficient of thermal expansion of the infrared detector chip. The next step would be to prepare the ROIC, top shim layer and bottom shim layer in accordance with the determined traverse coefficient of thermal expansions and thicknesses. The final step would involve wafer bonding the top layer of the shim to the ROIC to form the wafer bonded composite structure having the desired traverse coefficient of thermal expansion, prior to hybridization of the ROIC to the infrared detector chip.

BRIEF DESCRIPTION OF THE DRAWINGS

FIG. 1 (a) illustrates a prior art hybrid infrared detector array;

FIG. 1 (b) illustrates the misalignment which occurs during hybridization of a prior art hybrid infrared detector array;

FIG. 7 (a) is an elevational view of an infrared detector chip for which its transverse CTE is to be determined in accordance with the present invention;

FIG. 7 (b) is an elevational view of a composite structure having desired properties and thicknesses in accordance with the present invention;

FIG. 8 (a) illustrates the formation of the shim structure through wafer bonding;

FIG. 8 (b) illustrates the formation of a composite structure according to the properties and thicknesses of the composite structure depicted in FIG. 7(b) through wafer bonding.

DETAILED DESCRIPTION OF THE INVENTION

Figure 1A:
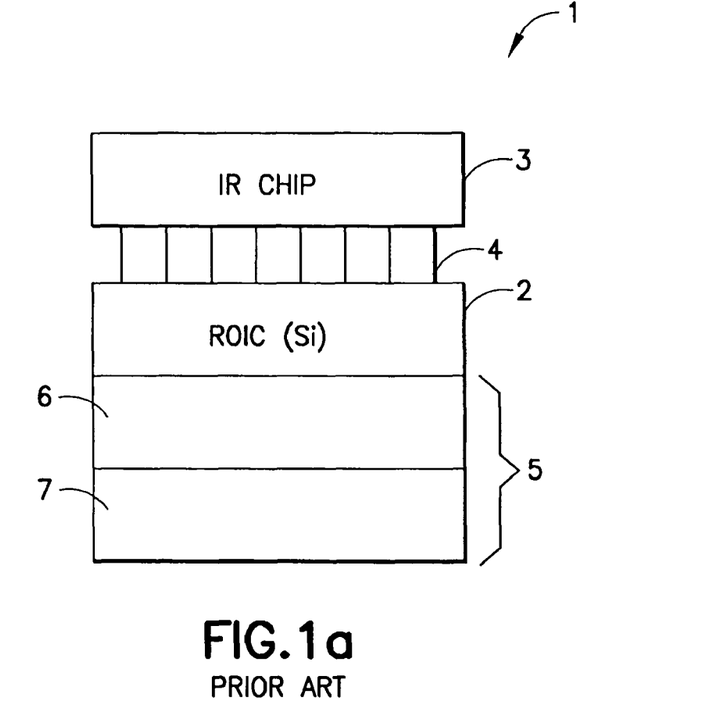

FIG. 1(a) represents a prior art hybrid radiation detector 1 which includes a conventional readout integrated circuit (ROIC) 2, infrared detector chip 3 hybridized to one another via indium bumps 4 and epoxy adhesives. Additionally, the hybrid radiation detector 1 employs a shim structure 5 which is attached via epoxy adhesives to the ROIC 2 after hybridization has occurred in order to try to match the CTE of the ROIC 2 with that of the infrared detector chip 3. The shim structure 5 in this prior art hybrid detector 1 is composed of a first titanium layer 6 or other metal with a high CTE and a second layer 7 composed of silicon. The first layer 6 of the shim 5 is bonded to the shim structure 5 via an epoxy adhesive and the second layer 7 is bonded to the first layer 6 via an epoxy adhesive. Although this prior art structure reduces some of the thermal mismatch problems during thermal cycling (e.g. cooling and operation of the hybrid detector 1), it still suffers from two significant disadvantages.

Figure 1B:
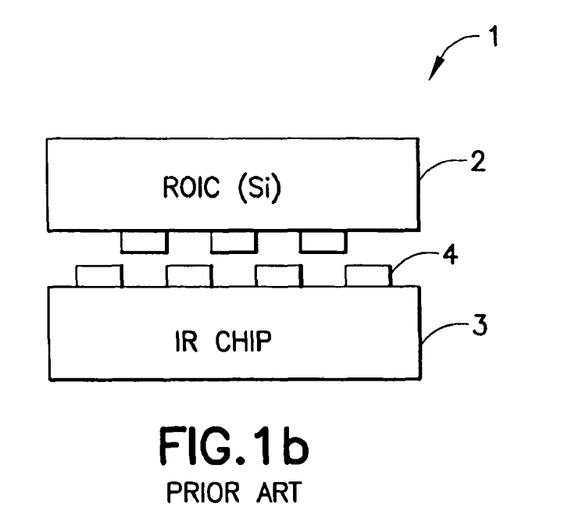

First, since the shim structure 5 has a metal component it is not infrared transparent, and thus this shim component 5 cannot be bonded to the ROIC 2 until after hybridization has already occurred. As already mentioned herein, the ramifications of not being able to apply the shim structure 5 prior to hybridization is that when hybridizing the ROIC 2 to the infrared chip 3 under elevated heating temperature (70-200° C.), the indium bumps 4 of the prior art structure will become misaligned due to thermal mismatch between the ROIC 2 and the infrared detector chip 3 as depicted in FIG. 1 (b).

Second, since the prior art typically employs epoxy adhesives in bonding its shim structure 5 to the ROIC 2, one will not be able to accurately predict the CTE values of the shim structure 5, the ROIC 2, or any of the components of the hybrid infrared detector array 1 because the effect of adhesives vary from batch to batch. Thus, and for example, one can obtain a large range of CTE's for the same composite shim structure when adhesives are used in its formation.

However, the present invention provides an ROIC which has a CTE matched to the CTE of an infrared chip not only after being hybridized but also during hybridization as well. In addition, the present invention provides the possibility of a hybridized infrared detector assembly which is formed entirely without the use of adhesives.

For the purposes of the discussion in this application, when referring to CTE, this will mean the CTE which is measured parallel to the transverse direction ("transverse CTE"). The transverse CTE is typically a known value for a specific material which can be easily obtained from a reference book or other relevant scientific publication. However, in case the transverse CTE is not a known value, it can nevertheless be readily calculated experimentally in the laboratory using known techniques in the art. The term "transverse CTE" and "CTE" are used interchangeably throughout this application, unless stated otherwise.

Figure 2:
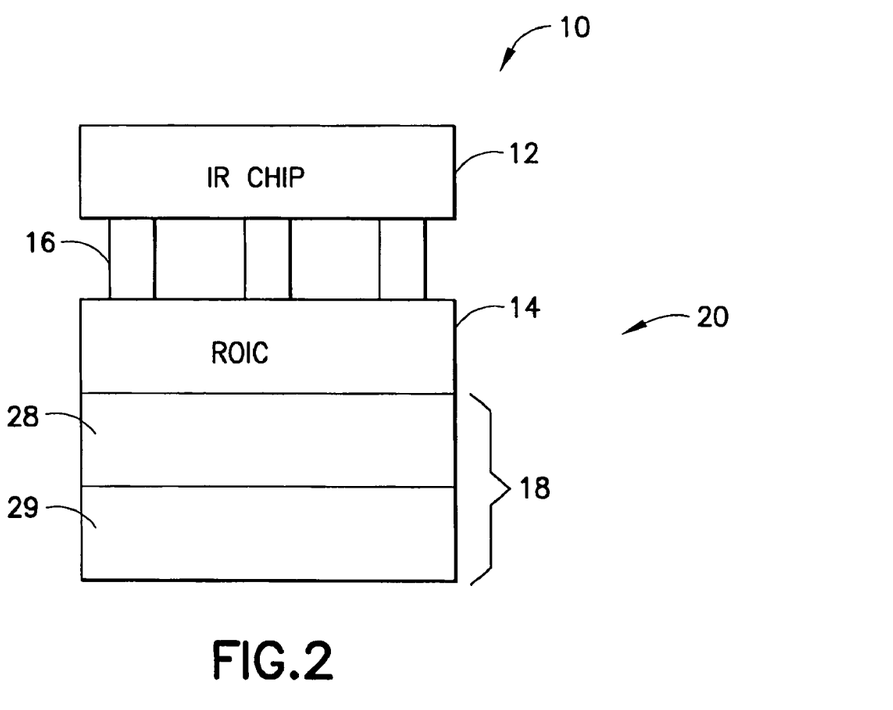
FIG. 2 is a perspective view of a hybrid infrared detector assembly of a first embodiment of the present invention.

Specifically, FIG. 2 illustrates a CTE matched hybridized infrared detector assembly 10 of a first embodiment of the present invention. The infrared detector assembly 10 includes a detector chip 12 that is mechanically and electrically interconnected to a readout chip (ROIC) 14 via metal bumps 16, preferably indium bumps. Further, included as part of the hybrid detector assembly 10 is a multi-layered substrate or shim structure 18 which is preferably infrared transparent. The shim structure 18 is bonded, preferably by direct wafer bonding, to the bottom exposed surface of the ROIC 14 to form a composite structure 20.

The infrared detector chip 12 employs a transparent substrate and an active infrared detection layer formed into an array of active photodiodes. The active infrared detection layer and the photodiodes formed therein may be conventional in nature. In a preferred embodiment, the transparent substrate may be composed of cadmium-telluride (CdTe) with the active infrared detection layer being an epitaxial layer of mercury-cadmium-telluride (HgCdTe). It will be appreciated, however, that other well known materials may also be employed for the transparent substrate and active layer; for example, a suitable combination of substrate and active layer may include any combination of Zn, Cd or Hg with any combination of Te or Se. Also an InSb active layer may be employed. Further, the substrate of the infrared detector chip 12 may be multiple layers of infrared transparent semiconductor materials. These semiconductor materials for the substrate layers include but are not limited to silicon, sapphire, and germanium.

The readout circuit (ROIC) 14 is preferably comprised of silicon. The specific circuitry employed in the readout circuit 14 may be completely conventional in nature, and varies with the specific application. It will be appreciated, however, that other types of readout IC materials may also be employed other than silicon; for example, gallium-arsenide ICs may be employed.

The composite structure 20 is a multilayer structure preferably composed of an odd number of substrate layers, e.g. 3, 5, 7 to prevent bowing of the composite structure as the temperature changes. However, for reasons of manufacturing convenience, it is most preferred that the composite structure 20 be formed of three layers as shown in FIG. 2. The first layer of the composite structure 20 is the ROIC 14. The remaining layers of the composite structure represent the shim portion 18. In the case of FIG. 2, the two remaining layers of the composite structure 20 are the top shim layer 28 and the bottom shim layer 29 (also known as the second and third layers of the composite structure, respectively). Moreover, these layers 28, 29 of the shim structure 20 are bonded to one another in preferably by a process known as direct wafer bonding, discussed in more detail below, in order to avoid the use of adhesives. The top shim layer 28 of the shim structure 18 is also preferably wafer bonded to the bottom exposed surface of the ROIC 14 to form the composite structure 20.

Also, each of the layers 28, 29 of the shim portion 18 of the composite structure 20 are transparent to infrared radiation, so as to allow the composite structure 20 to be formed prior to hybridization. By forming the CTE matched composite structure 20 prior to hybridization, one is enabled to have an ROIC 14 with a transverse CTE which is the same as or at least substantially the same as that of the transverse CTE of the infrared detector chip 12 not only after the hybridization process but during the hybridization process as well.

In designing a composite structure 20 which has a CTE which matches (substantially zero difference in CTE) or at least nearly matches (within a 5-10% CTE difference) the CTE of an infrared detector chip 12 during hybridization and also during thermal cycling of the subsequently produced hybrid detector assembly 10, it has been found that certain methods of the present invention successfully achieve these goals. Namely, the process for preparing the composite structure 20 of the present invention involves providing a certain transverse CTE to thickness ratio for the composite structure. This is accomplished preferably by selecting the layers for the composite structure 20 such that some layers have a transverse CTE which is greater then the transverse CTE of the infrared detector chip 12 and some layers have a transverse CTE less than that of the infrared detector chip 12, and then selecting the relative proportions (i.e. thickness) of the various layers to achieve the desired coefficient of thermal expansion for the composite structure 20 using a mathematical model discussed below.

It is further noted that the process of the present invention for preparing the transverse CTE matched composite structure is similar, in some respects to the methodology, described in U.S. patent application Ser. No. 10/418,870, filed on Apr. 18, 2003, hereby incorporated by reference in its entirety, an application which is directed to use of a composite wafer structure having its coefficient of thermal expansion matched to that of a deposited wafer structure. One difference between that application and the present invention is that the present invention involves matching the CTE of an ROIC 14 to that of an infrared detector chip 12. The particulars of designing the composite structure 20 of the present invention for matching the ROIC 14 to the infrared detector chip 12 are discussed below.

Specifically, in designing the composite structure 20 of the present invention, it is preferable to have a composite structure 20 which is symmetrical so as to prevent bowing of the structure when hybridized to the infrared detector chip 12. Accordingly, as mentioned, a three layered composite structure 20 is preferred. Additionally, the composite structure 20 should be comprised of at least two different semiconductor materials and some of these layers should a have transverse CTE greater than the transverse CTE of the infrared detector chip 12 and some of the layers should have a transverse CTE less than the transverse CTE of the infrared detector chip 12. Although, not required, it is also particularly preferred that the composite structure 20 be designed so as to be a mirror image of the infrared detector chip 12 by choosing the same materials, thicknesses and the same transverse CTE for the composite structure 20 as that of the infrared detector chip 12.

Figure 3:
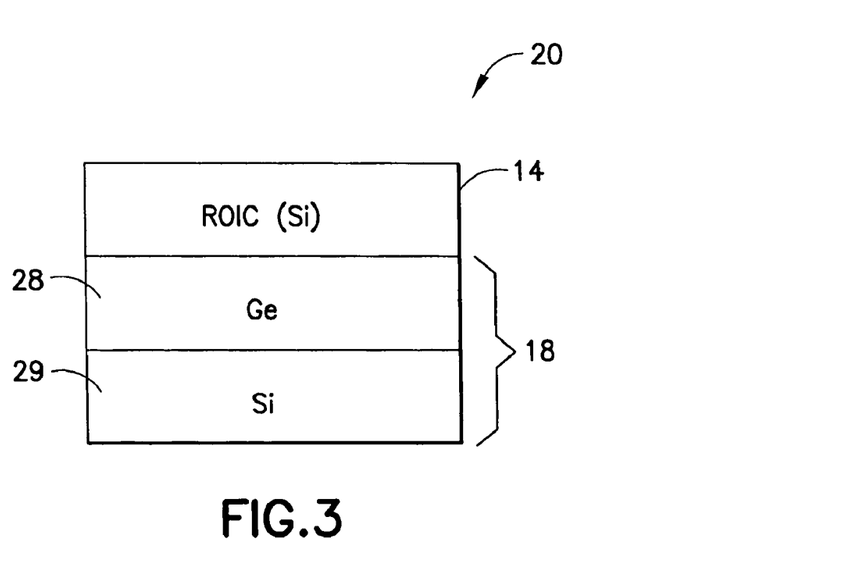
FIG. 3 is a perspective view of a three layered composite structure of the present invention having a ROIC (Si) first layer, a germanium second layer and a silicon third layer.

By way of example, the composite structure 20 embodiment of FIG. 3 is composed of a three layered structure composed of two different materials, i.e. silicon and germanium. In particular, in FIG. 3, the first layer is the ROIC 14 and is composed of the semiconductor material, silicon having a transverse CTE less that the transverse CTE of the infrared detector chip. Further, the remaining two layers make up the shim portion 18 of the composite structure 20. The shim portion 18 is composed of the top shim layer 28 and the bottom shim layer 29. The top shim layer 28 comprises the semiconductor material germanium having a transverse CTE greater than the transverse CTE of the infrared detector chip, and the bottom shim layer 29 is composed of silicon having the same CTE as the silicon of the first layer (ROIC) of the composite structure 20. For the purposes of symmetry, the first layer (ROIC) and bottom shim layer 29 of the three layered composite structure 20 are preferably comprised of the same material and have the same transverse CTE as one another, as in the case in the embodiment of FIG. 3. The first and third layers of these three layered structures also preferably have the same thicknesses as well.

It is noted however that the composite structure 20 of the present invention is not limited to the above semiconductor materials. In particular, except for the first layer which will typically be composed of silicon (because it is the ROIC), the shim portion 18 of the composite structure 20 may be formed of other semiconductor materials, so long as these materials are preferably infrared transparent and can also be wafer bonded to the first layer, i.e., to silicon. The shim 18 is preferably transparent to infrared radiation so that the ROIC 14 of the resulting composite structure 20 may aligned with the infrared detector chip 12 prior to hybridization taking place, in order to produce the beneficial results discussed above.

Figure 4:
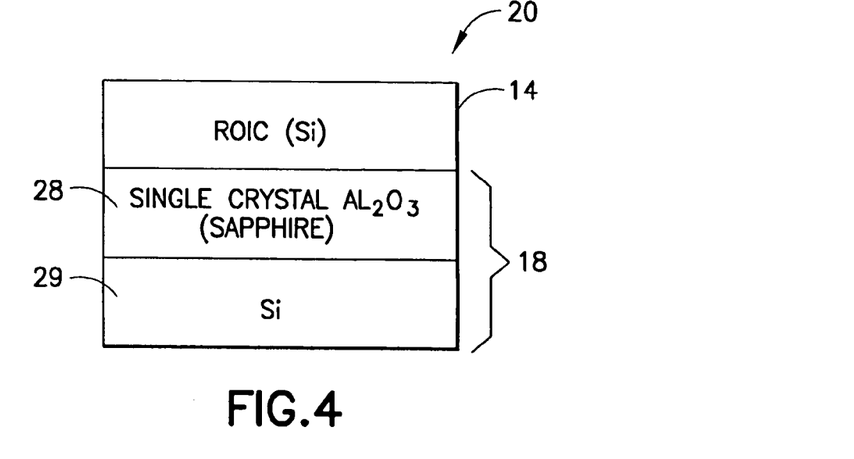
FIG. 4 is a perspective view of a three layered composite structure of the present invention having a ROIC (Si) first layer, a single crystal sapphire ($Al_2O_3$) second layer and a silicon third layer.
Figure 5:
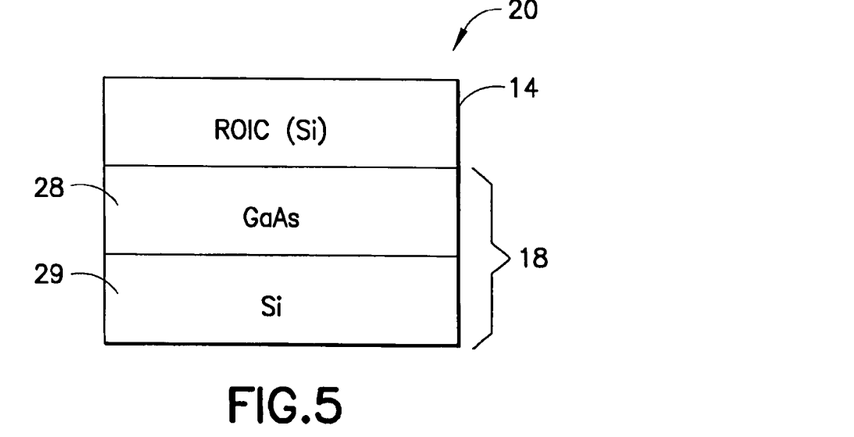
FIG. 5 is a perspective view of a three layered composite structure of the present invention having a ROIC (Si) first layer, a gallium-arsenide second layer and a silicon third layer.

Further examples of possible composite structures 20 in accordance with the present invention include a particularly preferred embodiment depicted in FIG. 4, wherein the composite structure 20 is a three layered structure comprising a first layer which is the ROIC 14 (silicon), a top shim layer 28 composed of single crystal $Al_2O_3$ (sapphire) and a bottom shim layer 29 composed of silicon. Further, in another embodiment of the present invention depicted in FIG. 5, the composite structure 20 is a three layered structure comprising a first layer which is the ROIC 14 (silicon), a top shim layer 28 composed of gallium-arsenide (Ga/As) and a bottom shim layer 29 composed of silicon. This embodiment in FIG. 5 is not preferred however due to the toxicity and contamination problems known to be related to gallium-arsenide (Ga/As).

Figure 6:
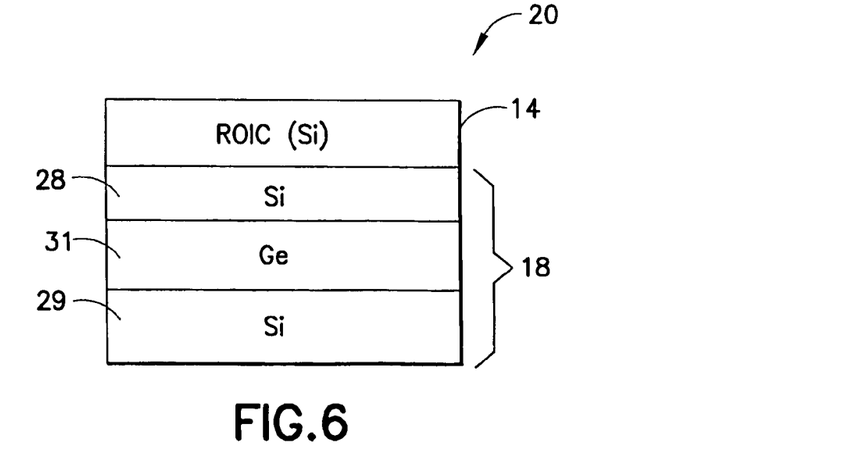
FIG. 6 is a perspective view of a four layered composite structure of the present invention having a ROIC (Si) first layer, a silicon second layer, a germanium third layer and a silicon fourth layer.

In yet another embodiment of the present invention depicted in FIG. 6, the composite structure 20 is a four layered structure. The first layer of the composite structure 20 is the ROIC 14 composed of silicon. The shim portion 18 of the composite structure 20 comprises the remaining three layers of the composite structure 20. Shim portion 18 comprises a top shim layer 28 composed of silicon, a middle shim layer 31 composed of geranium and a bottom layer 29 composed of silicon.

Now referring to FIGS. 7(a)-FIG. 9, methods of fabricating the composite structure 20 in accordance with the present invention are specifically illustrated. These methods are by way of example only and are in no way meant to limit the scope of the present invention. In this regard, any method may be used for producing a wafer bonded composite structure 20 which has a shim portion 18 which is preferably infrared transparent and thus may be bonded to the ROIC 14 before hybridization to provide the ROIC 14 with a transverse CTE which matches or at least nearly matches the transverse CTE of the infrared detector, during both hybridization and thermal cycling.

Figure 7A:
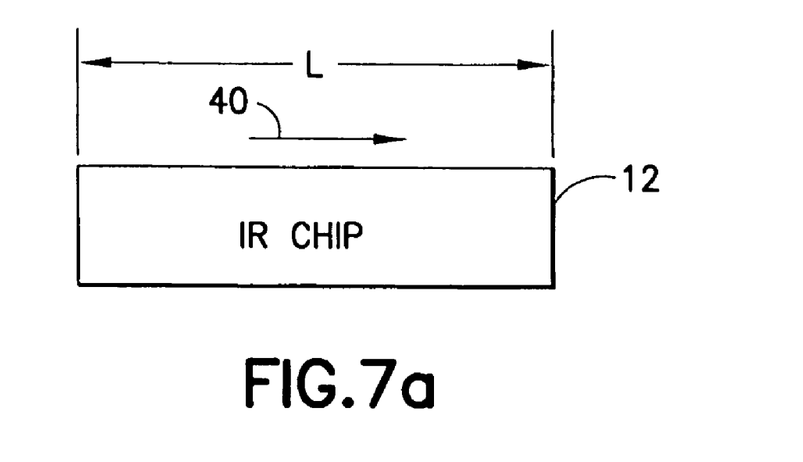

By way of a method example however, first one determines the CTE of the infrared detector chip measured parallel to a transverse direction 40, i.e. "the transverse CTE" of the infrared detector chip (shown in FIG. 7 (a)). As discussed the transverse CTE for many semiconductor materials can simply be found in a relevant scientific reference guide or manual known in the art. For materials for which the transverse CTE is not known, the transverse CTE's for these materials can nonetheless be readily calculated experimentally using laboratory techniques known in the art. All transverse coefficients of thermal expansion discussed herein are measured parallel to each other and to the transverse direction 40, and all are measured over the same temperature range associated with hybridization (e.g., room temperature—to about 200° C.) and thermal cycling/operation of the IR hybrid detector 10 (e.g., 300 K to about 77 K)

Next, after determining the CTE for the infrared detector chip 12 one constructs a composite structure 20 with a transverse CTE which matches or at least nearly matches that of the infrared detector chip 12. This is done preferably by first selecting layers for the composite structure 20 such that some of the layers have a transverse CTE greater than that of the transverse CTE of the infrared detector chip 12, and some have a transverse CTE less than the transverse CTE of the infrared detector chip 12. The transverse CTE for each of the layers are determined by the same method as discussed above for determining the transverse CTE for the infrared detector chip 12.

Figure 7B:
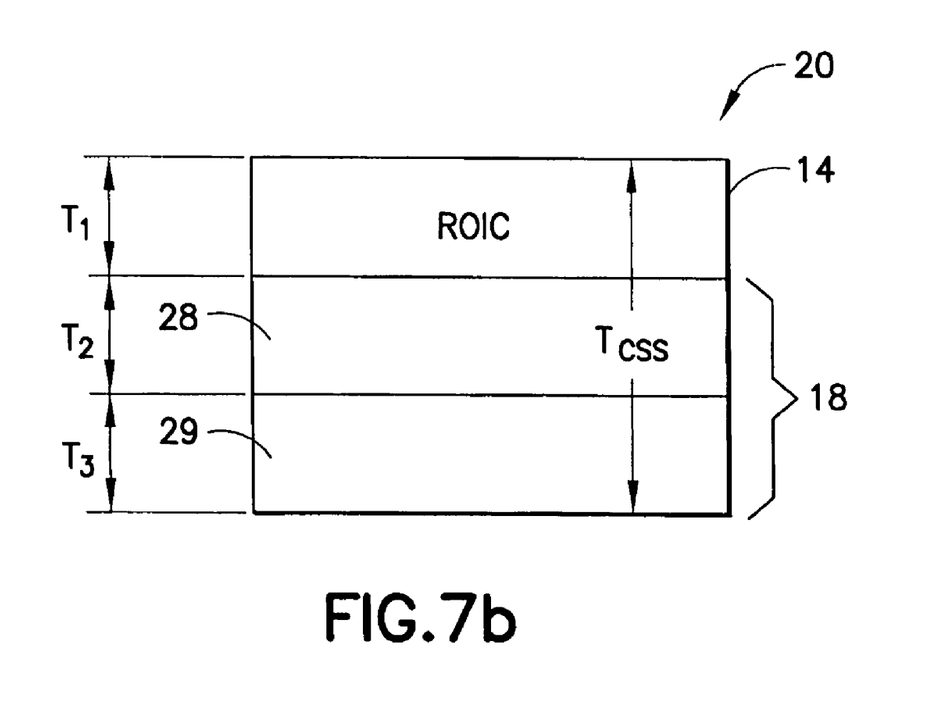

For instance, FIG. 7(b) depicts a model of a composite structure 20 which has is composed of layers having certain properties (i.e. CTE's) and thicknesses which were determined using a mathematical model to provide a desired CTE for the composite structure 20, resulting in a thermally matched ROIC to infrared chip (of FIG. 7(a)). In this example, the first layer is the ROIC 14 comprised of silicon having a transverse CTE less than the transverse CTE of the infrared detector chip 12 shown in FIG. 7 (a). The shim portion 18 is comprised of the top shim layer 28 having a transverse CTE greater than the CTE of the infrared detector chip and the bottom shim layer 29 having a transverse CTE equal to the transverse CTE of the ROIC 12 layer. The transverse CTE for each of the layers can be determined in the same manner as the CTE for the infrared detector chip 12, as discussed above.

Once the transverse CTE for each of the layers is determined, then the thicknesses for each of the layers is calculated using a mathematical model. In particular, the thicknesses (i.e. $T_1$, $T_2$, $T_3$) depicted in FIG. 7 (b) for each of the layers of the composite structure 20 may be calculated using a mathematical model to achieve a CTE for the composite structure 20 which matches the transverse CTE of the infrared chip 12 (of FIG. 7 (a)), when these particular thicknesses are used in combination with the particular transverse CTE's of each of the layers of the composite structure 20. The formula for the mathematical model of the present invention discussed herein is set forth below:

$$CTE_{css} = (t_1/t_{css} \times CTE_{fsl}) + (t_2/t_{css} \times CTE_{ssl}) + (t_3/t_{css} \times CTE_{tsl}).$$

wherein:

$CTE_{css}$=transverse CTE of the composite structure
$T_1$=thickness of first layer
$T_2$=thickness of second layer
$T_3$=thickness of third layer
$T_{css}$=the total thickness of the composite structure
$CTE_{fsl}$=the CTE of the first layer measured parallel to the traverse direction
$CTE_{ssl}$=the CTE of the second layer of the composite structure measured parallel to the traverse direction
$CTE_{tsl}$=the CTE of the third layer of the composite structure measured parallel to the transverse direction As is evident, one can use the above mathematical model to match the CTE of a composite structure 20 to any infrared detector chip 12 over the required temperature ranges (i.e hybridization and thermal cycling temperatures), simply by altering the combinations/ratios of thicknesses and CTE's for each of the layers of the composite structure. In any case, once the desired combination/ratio of materials (e.g. semiconductor materials and CTE's) and dimensions (thicknesses) for layers of the composite shim structure 20 are determined which achieve a desired transverse CTE for the composite structure 20, the composite shim structure 20 is then constructed in accordance with these properties, such as, for example, in accordance with the composite structure depicted in FIG. 7(b).

Figure 8A:
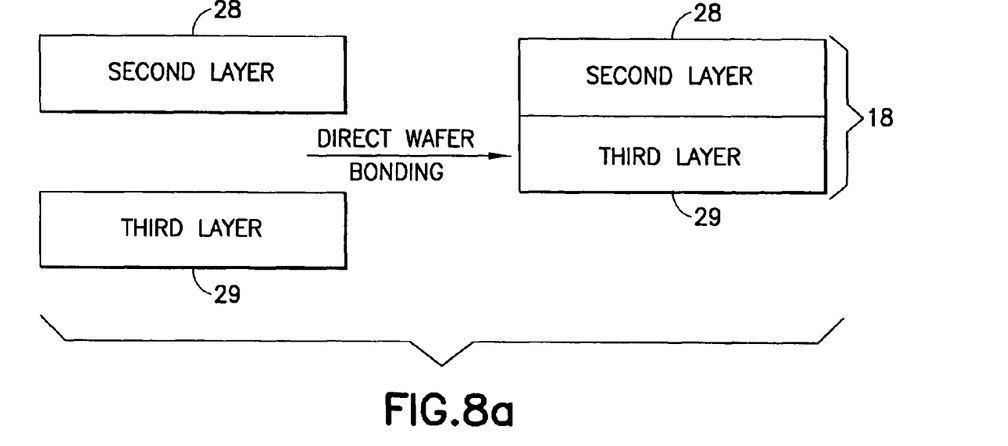
Figure 8B:
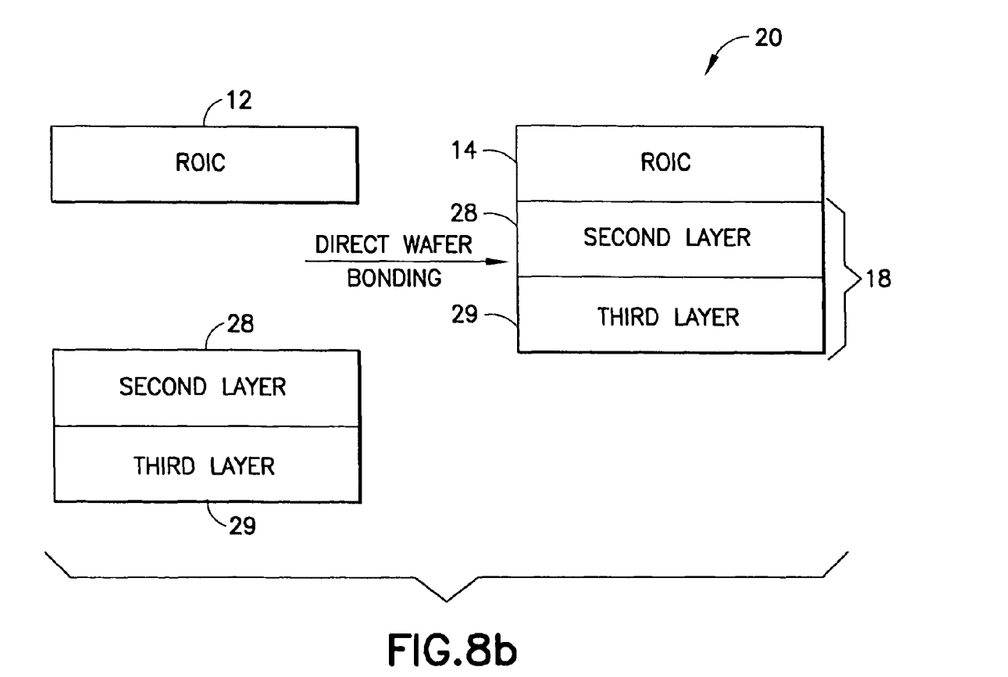

After constructing the layers of the composite structure 20 according to the desired materials and thicknesses determined using the mathematical model and illustrated in FIG. 7(b), these specifically prepared layers are bonded together preferably by any conventional direct wafer bonding process (FIG. 8 (a)) to form the composite structure 20 of FIG. 8(b). Specifically, the second 28 and third layer 29 depicted FIG. 8(a) are wafer bonded together to form the shim portion 18 of the composite structure 20. The shim portion 18 formed is then wafer bonded to the first layer 14 (ROIC) to form the composite structure 20 of FIG. 8 (b), which as mentioned above was designed in accordance with the properties and thickness of the composite structure 20 depicted in FIG. 7(b).

The wafer bonding process does not have to be performed in the above order. Alternatively, one could wafer bond the second layer 28 to the exposed bottom surface of the ROIC 12 and the third layer 29 could then be bonded to the second layer 28 to form the composite structure 20.

With direct wafer bonding, each layer is first properly cleaned, polished, flattened so that adjacent layers can be bonded together simply by bringing these layers into contact with one another at room temperature. The layers then adhere to each other simply by pressing them together. There is no use of adhesives in the direct wafer bonding process. The fact that the wafer bonding process allows for the composite structure 18 to be prepared without the use of any adhesives is a highly significant advantage of the present invention because of the effect, as mentioned, that adhesives have on the CTE of a semiconductor chip or structure that can vary from batch to batch. Therefore, an undesirably large range of CTE's for the same composite structure can be obtained when using adhesives.

Figure 9:
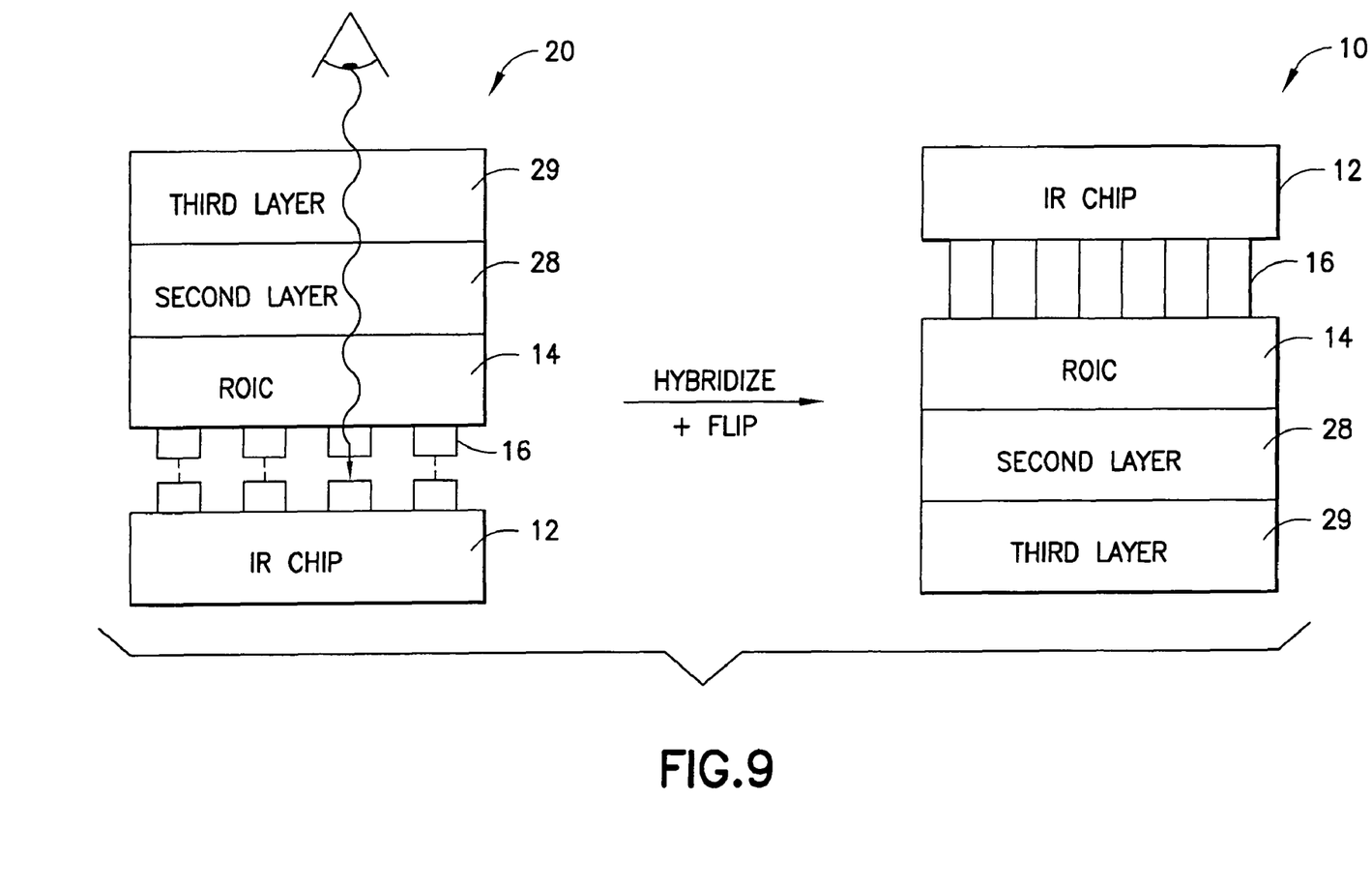
FIG. 9 illustrates the formation of a hybrid infrared detector assembly of the present invention through flip chip hybridization.

Finally, after the composite structure 20 has been produced prior to hybridization, this structure 20 is then hybridized to the infrared detector chip 12 by preferably any conventional flip-chip technology. By way of example, in conventional flip-chip processes (as shown in FIG. 9), one typically views through an infrared camera in order to align the ROIC 14 of the composite structure 20 to the infrared chip 12 using the reticles on each chip. Once alignment is complete, the two chips 12, 14 are then squeezed together in order to fuse the indium bumps 16. The hybridization process causes the individual elements on the IR chip to be in electrical contact with the circuitry of the ROIC chip to form the hybrid infrared detector array 10.

Additionally, in accordance with the present invention, the above hybridization process may also be performed under elevated temperatures (e.g. 70-200° C.). Generally, hybridization performed under elevated temperatures generally leads to misalignment of the indium bumps of the ROIC and IR chip (FIG. 1 (b)), due to the substantial mismatch between CTE's between these two chips. However, because the shim 18 of the present invention is preferably infrared transparent it can be wafer bonded to the ROIC 14 prior to hybridization to form the composite structure 20 and the composite structure 20 can then be hybridized to the infrared detector chip 12 to provide an ROIC 12 which has a transverse CTE which matches, or at least substantially matches, the transverse CTE of the infrared detector chip 12, thereby avoiding thermal mismatch problems encountered when performing hybridization under elevated temperatures.

It is again noted that the shim 18 of the present invention is not limited to hybrid detector arrays, but may be applied for use with any two type of semiconductor devices to be hybridized together.

Although a particular embodiment of the invention has been described in detail for purposes of illustration, various modifications and enhancements may be made without departing from the spirit and scope of the invention. Accordingly, the invention is not to be limited except as by the appended claims.

The invention claimed is:

1. A composite structure for matching a coefficient of thermal expansion of a read out integrated circuit ROIC to a coefficient of thermal expansion of an infrared detector chip in order to provide a thermally matched hybridized semiconductor chip assembly, comprising:

the ROIC having a top and a bottom surface, said ROIC having a coefficient of thermal expansion which is different than the coefficient of thermal expansion of the infrared detector chip;

a substrate having a surface that is direct wafer bonded to a bottom surface of the ROIC chip to form a direct wafer bonded composite structure, where the substrate surface is in direct physical contact with the bottom surface of the ROIC chip; and wherein said direct wafer bonded composite structure has a coefficient of thermal expansion that at least substantially matches the coefficient of thermal expansion of the infrared detector chip, thereby providing thermal matching between the ROIC and the infrared detector chip;

wherein said composite structure is comprised of three direct wafer bonded layers, with a first layer being said ROIC being comprised of a first semiconductor material, wherein said coefficient of thermal expansion of the ROIC is less than said coefficient of thermal expansion of said infrared detector chip, a second layer comprising a second semiconductor material with a coefficient of thermal expansion greater than said coefficient of thermal expansion of said infrared detector chip, and a third layer comprising a third semiconductor material with a coefficient of thermal expansion less than said coefficient of thermal expansion of said infrared detector chip, and wherein the second layer is disposed between the ROIC and the third layer.

2. The composite structure of claim 1, wherein said direct wafer bonded substrate is transparent to infrared radiation.

3. The composite structure of claim 1, wherein said first layer and said third layer of the composite structure each have the same thickness and the same coefficient of thermal expansions.

4. The composite structure of claim 1, wherein said first semiconductor material is comprised of silicon, said second semiconductor material is comprised of germanium and said third semiconductor material is comprised of silicon.

5. The direct wafer bonded composite structure of claim 1, wherein said coefficient of thermal expansion of said composite structure does not differ from said coefficient of thermal expansion of said infrared detector chip by more than about 5% to about 10%.

6. The composite structure of claim 1, wherein said coefficient of thermal expansion of said composite structure exactly matches said coefficient of thermal expansion of said infrared detector chip.

7. The composite structure of claim 1, wherein said composite structure is designed to have a coefficient of thermal expansion to thickness ratio for each of the three layers in order to achieve a desired coefficient of thermal expansion for the composite structure which is substantially equal to the coefficient of thermal expansion of the infrared detector chip.

8. A composite structure for matching a coefficient of thermal expansion of an ROIC to a coefficient of thermal expansion of an infrared detector chip to provide a thermally matched hybrid infrared detector array, comprising:
   a readout circuit (ROIC) having a top and a bottom surface, said ROIC having a coefficient of thermal expansion which is less than a traverse coefficient of thermal expansion of the infrared chip detector;
   a shim which is transparent to infrared radiation, said shim comprising a top shim layer and a bottom shim layer direct wafer bonded to one another, said top shim layer comprising a first semiconductor material with a coefficient of thermal expansion greater than said coefficient of thermal expansion of said infrared detector chip and said bottom layer comprising a second semiconductor material with a coefficient of thermal expansion less than said coefficient of thermal expansion of said infrared detector chip, said top shim layer of said shim being direct wafer bonded to the bottom surface of said ROIC to form a direct wafer bonded composite structure, where the top shim layer is in direct physical contact with the bottom surface of the ROIC chip; and
   wherein said direct wafer bonded composite structure has a coefficient of thermal expansion that at least substantially matches the coefficient of thermal expansion of the infrared detector chip, thereby providing thermal matching between the ROIC and the infrared detector chip.

9. The composite structure of claim 8, wherein said ROIC and said bottom shim layer of said composite structure each have the same thickness and the same coefficient of thermal expansions.

10. The composite structure of claim 8, wherein said ROIC is comprised of the semiconductor material silicon, said top shim layer is comprised of single crystal $Al_2O_3$ (sapphire) and said bottom shim layer is comprised of silicon.

11. The composite structure of claim 8, wherein said ROIC is comprised of the semiconductor material silicon, said top shim layer is comprised of germanium and said bottom shim layer is comprised of silicon.

12. The composite structure of claim 8, wherein said ROIC is comprised of silicon, said top shim layer is comprised of gallium-arsenide (GaAs) and said bottom shim layer is comprised of silicon.

* * * * *